(12) United States Patent
Kuo et al.

(10) Patent No.: US 6,174,189 B1
(45) Date of Patent: Jan. 16, 2001

(54) FIXING DEVICE FOR INTERFACE CARDS

(75) Inventors: Eric Kuo, Taipei Hsien; Anita Chiu, Taipei, both of (TW)

(73) Assignee: Lite-On Enclosure Inc., Taipei (TW)

( * ) Notice: Under 35 U.S.C. 154(b), the term of this patent shall be extended for 0 days.

(21) Appl. No.: 09/234,307

(22) Filed: Jan. 21, 1999

(51) Int. Cl.[7] .................................................. H01R 13/62
(52) U.S. Cl. ............................................... 439/327; 439/61
(58) Field of Search ..................................... 439/325–328; 361/801, 803, 788, 789; 211/41, 50; 403/409.1

(56) References Cited

U.S. PATENT DOCUMENTS

| | | | |
|---|---|---|---|
| 5,090,840 | * | 2/1992 | Cosenza ................................ 439/327 |
| 5,383,793 | * | 1/1995 | Hsu et al. ............................. 439/327 |
| 5,706,173 | * | 1/1998 | Carney et al. ........................ 439/327 |
| 5,822,197 | * | 10/1998 | Thuault ................................ 439/327 |
| 6,022,234 | * | 2/2000 | Shinoto et al. ....................... 439/327 |

* cited by examiner

Primary Examiner—Hien Vu
(74) Attorney, Agent, or Firm—Rosenberg, Klein & Lee

(57) ABSTRACT

A fixing device for interface cards includes a seat. A plurality of spacers are installed on one surface of the seat. Several teeth are mounted on the top end of the spacer, while the lower portion thereof is formed with a holding device. Furthermore, a sliding block is slidably engaged on the top portion of the spacer. The sliding block is formed with teeth corresponding to the teeth of the spacer. The fixing device can be mounted in the casing of a computer mainframe in correspondence with the circuit board inserting slot within a computer mainframe. Accordingly, when an interface card is required to be inserted into the computer, the sliding block is moved upwards. Then, the interface card is passed into the holding device, and then is inserted into the inserting slot of the main circuit board. Thereafter, the sliding block is moved downwards to rest against the top end of the interface card to fully fix the interface card.

7 Claims, 4 Drawing Sheets

FIXING DEVICE FOR INTERFACE CARDS

BACKGROUND OF THE INVENTION

1. Field of the Invention

The present invention relates to a fixing device for interface cards, and in particular to a fixing device by which various kinds of interface cards of different elevations can be fixed within a computer mainframe, and thus, assembly cost and time can be saved.

2. Description of the Prior Art

In general, various kinds of interface cards are inserted into a computer mainframe. A large interface cards is often inserted with a large number of interface cards of different sizes. However, since each interface card has an individual height and length, so that as an interface card is fixed, it needs to have fixing device of a different size than that used for an interface card of a different size. Thus, this is inconvenient in assembling the mainframe and much time is necessary for the assembly process. However, some designs have been developed to solve the problems induced from the length differences of interface cards, while there have been no designs being used to solve the problems relating to differences in the elevations of interface cards.

SUMMARY OF THE INVENTION

Accordingly, the object of the present invention is to provide a fixing device for interface cards. The fixing device includes a seat. A plurality of spacers are installed on one surface of the seat. Several teeth are formed on the top end of the spacer, while the lower portion thereof is installed with a holding device. Furthermore, a sliding block is installed and is slidably engaged on the top portion of the spacer. The sliding block is formed with teeth respectively engaged with the teeth of the spacer. Therefore, the fixing device can be buried within the casing of a computer mainframe in respective alignment with one side of the circuit board inserting slot within the computer mainframe. Accordingly, when an interface card is required to be inserted into a slot, the sliding block moves upwards, the interface card then penetrates through the holding device, and is then inserted into the inserting slot of the circuit board. Thereafter, the sliding block moves downwards to rest against the top end of the interface card to fully fix the interface cards. Thus, by the structure of the present invention, a fixing device is provided that is suitable for all kinds of interface cards of different elevations to be fixed into a computer mainframe. As a result, assembly cost and labor hours are greatly reduced.

Another object of the present invention is to provide a fixing device for interface cards, where a movable block is installed on a sliding block. The movable block is formed with teeth for engagement with the teeth of the spacer. Thus, if an interface card is required to be inserted, the movable block can be moved firstly to disengage the teeth of the movable block from the teeth of the spacer. Thus, it can be easily displaced upwards and downwards.

A further object of the present invention is to provide a fixing device for interface cards, wherein two respective clamping pieces are installed on the holding device. The width of the two clamping pieces serves to clamp an interface card. One end of the fixing device for receiving an interface card has an enlarged portion, thus an interface card will be easily and conveniently inserted therein. Accordingly, as an interface card is inserted into a circuit board inserting slot, one side of the interface card first passes between the two clamping pieces, and then is further inserted into the circuit board slot to be clamped by the two clamping pieces.

Still another object of the present invention is to provide a fixing device for interface cards, wherein each of two sides of the spacer is installed with a respective convex pillar. Further, each side of the sliding block is formed with a respective long slot. The convex pillar is installed within the long slot so that the sliding block only moves within the extend of the long slot. As the sliding block is moved to the outside of the spacer, the sliding block will not wholly separate from the spacer. Meanwhile, the sliding block is moved backwards along the convex pillar in order to not hinder the insertion of the interface card.

The present invention will be better understood and its numerous objects and advantages will become apparent to those skilled in the art by referencing to the following drawing in which:

DETAILED DESCRIPTION OF THE PREFERRED EMBODIMENT

Figure 2:
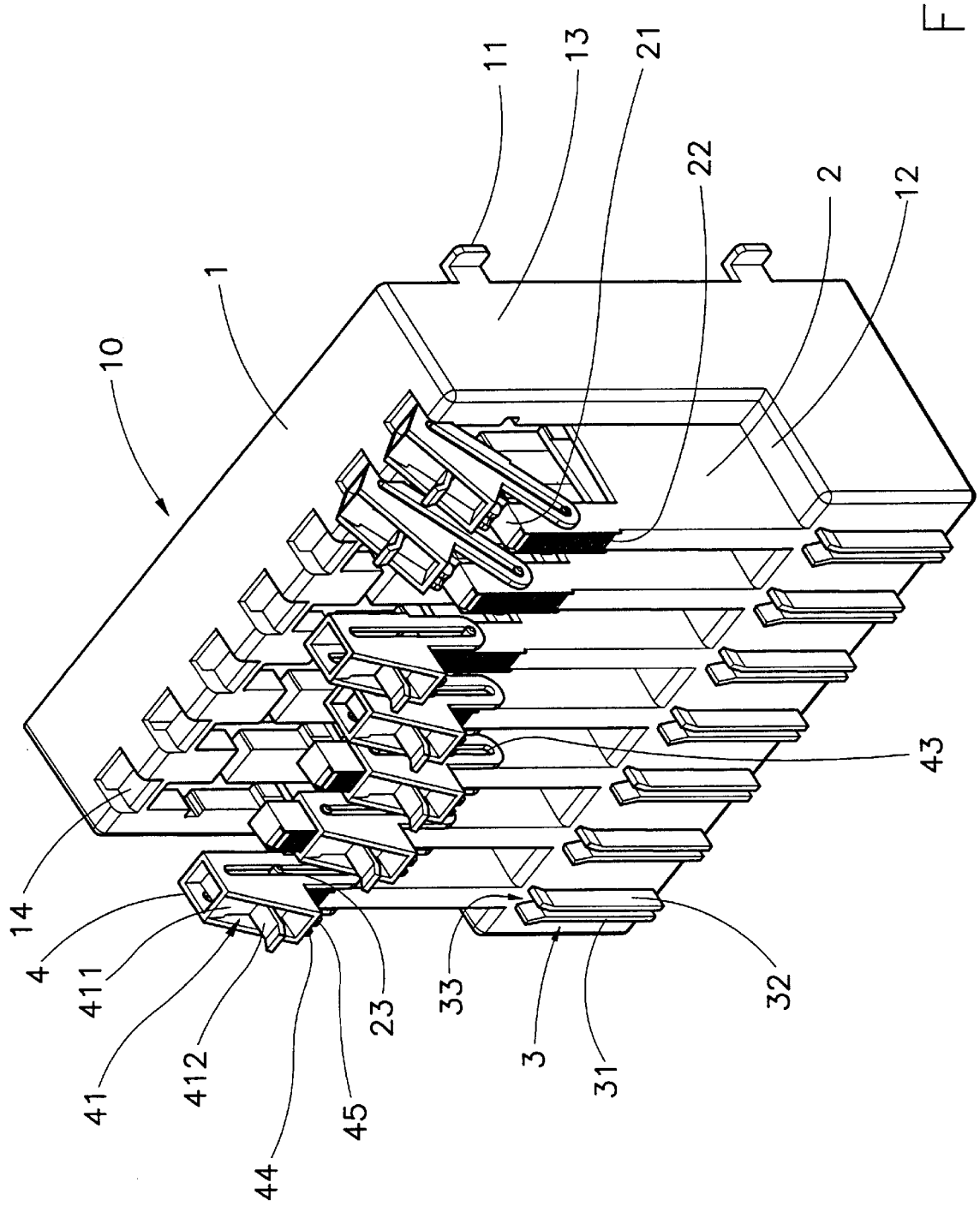
FIG. 2 is a perspective view of the fixing device of the present invention.

With reference to FIG. 2, the fixing device for interface cards of the present invention is illustrated. The fixing device 10 includes a seat 1. Coupling elements 11 are installed on one end of lateral sides of the seat 1 for mounting to the casing of a computer. Another end of the lateral sides of the seat 1 have an L-shaped contour. A plurality of upstanding spacers 2 with an equal space therebetween are formed on the transverse surface 12 of the L-shaped end. A straight pillar 21 is formed near the front side of each spacer 2. A blank of teeth 22 is mounted on the front side of the straight pillar 21. Further, each of two sides of the straight pillar 21 corresponding to the teeth 22 each have a pin 23 extending therefrom. A notch 14 is formed on the edge of the top straight surface 13 of the seat 1 in correspondence with each spacer 2.

In the present invention, a holding device 3 is installed on the front end of the transverse surface 12 of the seat 1. The holding device 3 is formed by two respective clamping pieces 31 and 32. The width of the two clamping pieces 31 and 32 are exactly sufficient to clamp an interface card 20 (shown in FIG. 1). The inserting end of the holding device 3 has an enlarging portion 33 so that the interface card 20 can be easily and conveniently inserted.

Figure 3:
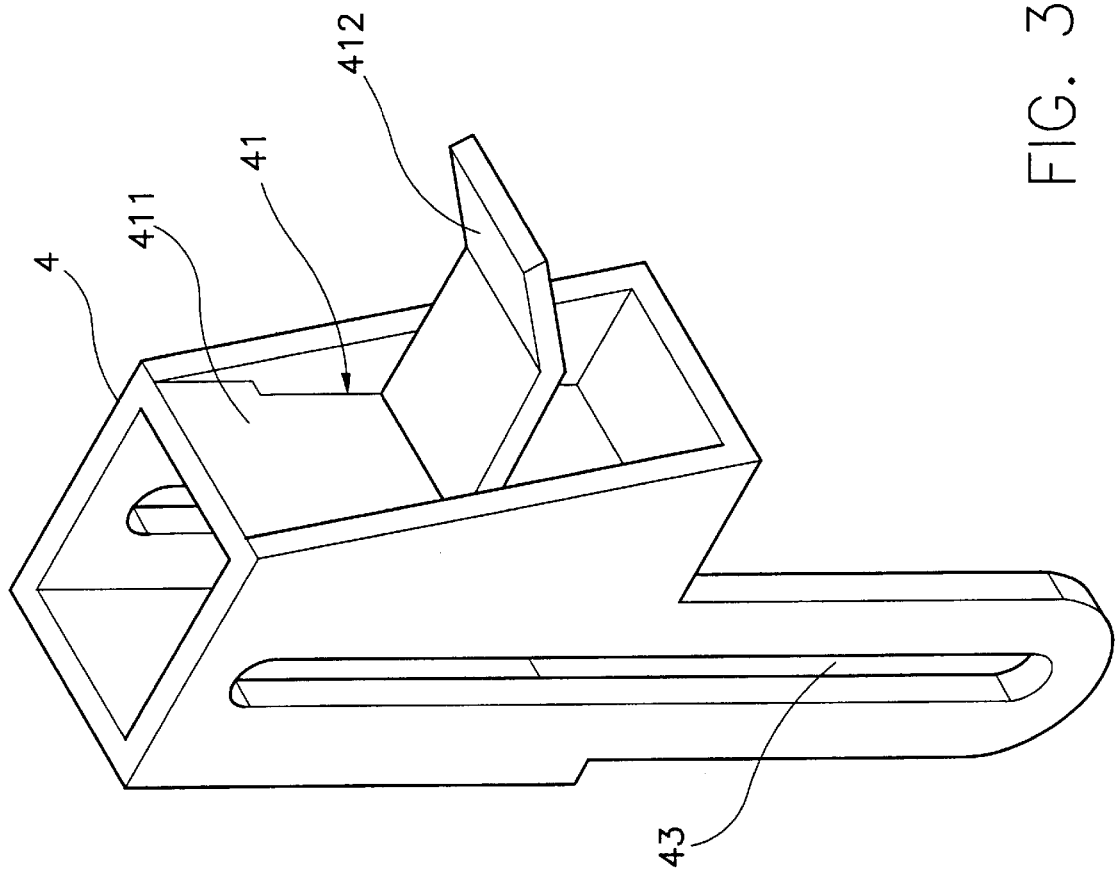
FIG. 3 is a perspective view of the sliding block of the present invention.
Figure 4:
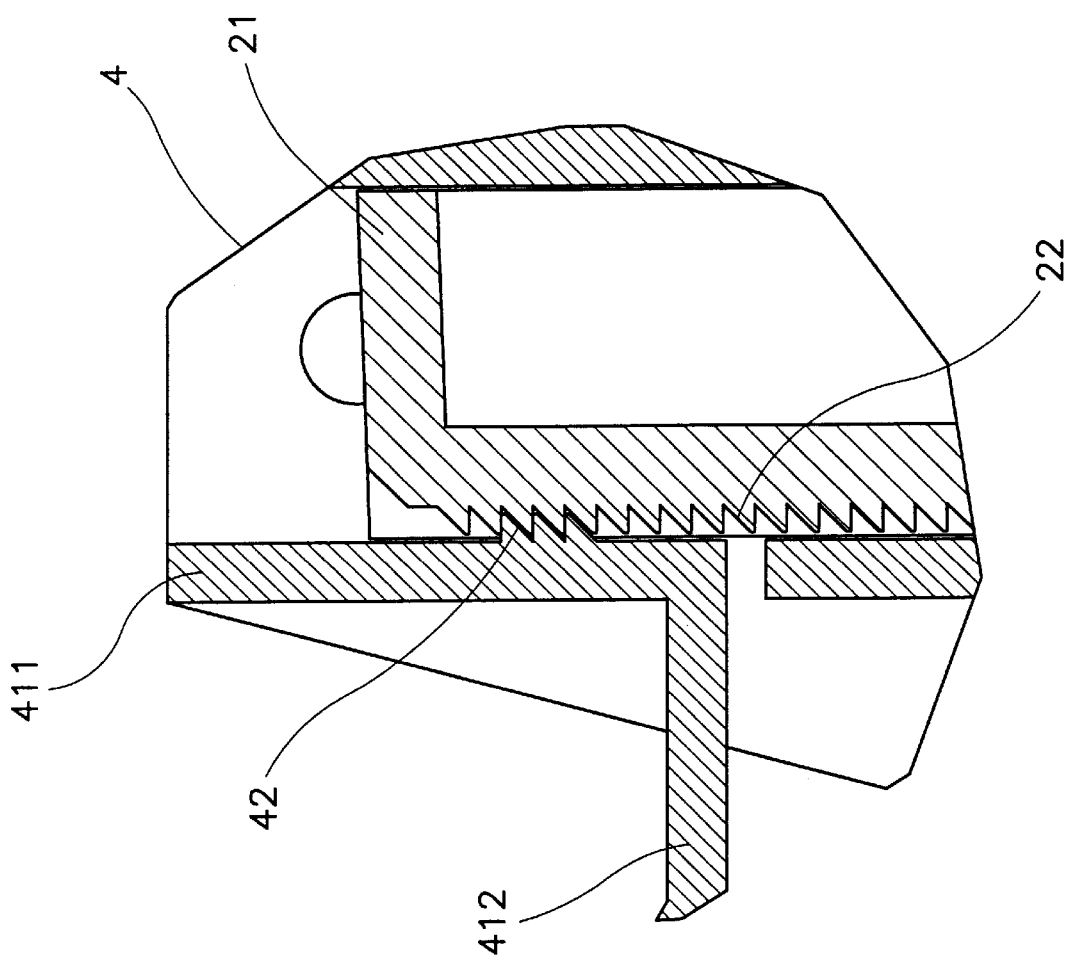
FIG. 4 is a partial cross-sectional view of the present invention showing engagement between a sliding block and a straight pillar.

Referring to FIGS. 2 and 3, in the present invention, a sliding block 4 is installed, which has a hollow shape, so as to be slidably engaged with the straight pillar 21. A movable block 41 is mounted on the sliding block 4 facing the teeth 22. The movable block 41 comprises a first plate 411 with one end coupled to the sliding block and two sides of which are spaced from the sides of the sliding block 4, instead of being connected thereto, so that the first plate 411 has elasticity. The first plate 411 is installed with teeth 42 mating with the teeth 22 of the straight pillar 21. As shown in FIG.

4, a second plate 412 extends from the first plate 411. Further, along slots 43 are formed in the two sides of the sliding block 4, in correspondence with pin 23. Each pin 23 is positioned within a respective long slot 43, so that the lower end of a respective sliding block 4 only moves within the extend of the long slot 43. Additionally, two confining blocks 44 and 45 in correspondence with the two clamping pieces 31 and 32 are installed on the lower end of the sliding block 4.

Figure 1:
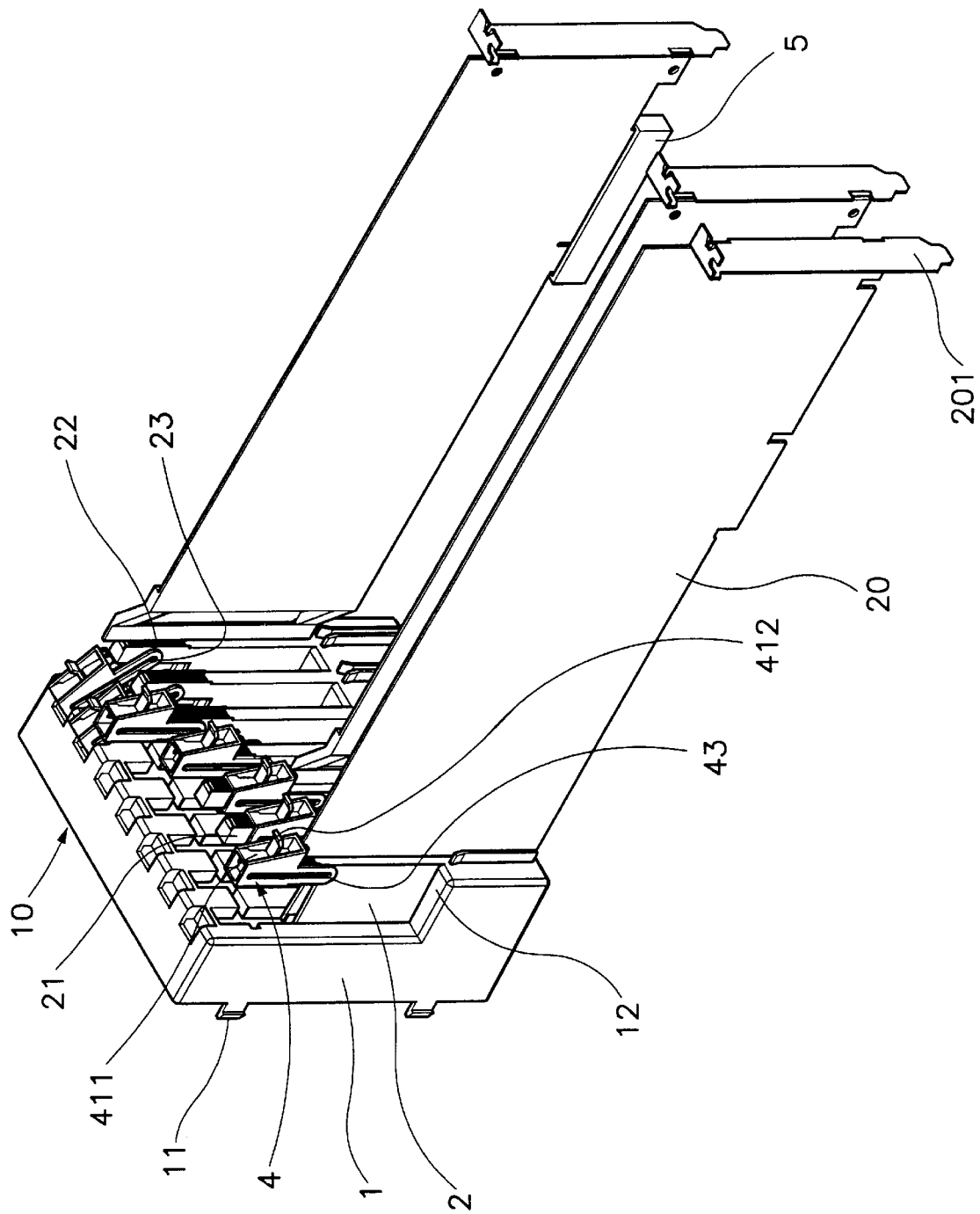
FIG. 1 is a perspective view of the present invention with interface cards installed.

Referring to FIG. 1, one application of the present invention is illustrated. The fixing device 10 can be mounted to the casing of a computer mainframe and is in correspondence with circuit board inserting slots 5 of a computer's main circuit board. When the user desires to insert an interface card 20, the second plate 412 on the moving block 41 is first moved to pull the second plate 412 backwards and thus disengage the teeth 42 on the second plate 412 from teeth 22 of the straight pillar 21, so that the sliding block 4 easily moves upwards and downwards. At the same time, the sliding block 4 is pulled upwards. As the sliding block 4 is moved toward the top of the spacer 2, the lower end of the long slot 43 of the sliding block 4 is stopped by the pin 23 so that the sliding block 4 will not completely separate from the spacer 2. Meanwhile, the sliding block 4 is moved backwards along the convex pillar 23 so as to be obliquely positioned on the notch 14 of the seat 1, in order to not hinder the insertion operation of the interface card 20.

In the preferred embodiment of the present invention, one end of an interface card 20 is firmly coupled to a fixing connecting piece 201 for installation within the computer mainframe. The other end of the interface card 20 is firmly secured to the fixing device 10. Then, the end of the interface card 20 without the fixing connecting piece 201 passes between the two clamping pieces 31 and 32 of the holding device 3, and then the interface card 20 is further inserted into the inserting slot 5 of the computer's main circuit board. Thereafter, after the interface card 20 has been inserted, the sliding block 4 is pulled forward, and then the second plate 412 is pulled backwards so that the sliding block 4 moves downwards to the top end of the interface card 20, to cause the two confining block 44 and 45 formed on the sliding block 4 to clamp the interface card 2. Next the teeth 42 on first plate 411 engage with the teeth 22 of the straight pillar 21 to fix the position of the sliding block 4. Thus, the firm installation of the interface card 20 is completed.

By virtue of the fixing device 10 of the present invention, one fixing device 10 is suitable for securing all kinds of interface cards 20, of different elevations, into a computer mainframe. As a result, much of the cost of assembly and time are saved.

Although the present invention has been described using a specific embodiment, the example is meant to be illustrative and not restrictive. It is clear that many other variations would be possible without departing from the basic approach, demonstrated by the present invention. Therefore, all such variations are intended to be embraced within the scope of the invention as defined in the appended claims.

What is claimed is:

1. A fixing device for interface cards of different heights, comprising:

a seat having a first surface fixed into a casing of a computer mainframe, and a second surface formed with a plurality of spacers having an equal space therebetween, a front side of each spacer being formed with a respective holding device for clamping engagement with one end of an interface card, each of said spacers having a top portion and a pin extending from a side thereof; and, a plurality of sliding blocks respectively mounted for movement upwards and downwards on the top portion of said spacers, each of said sliding blocks having (a) positioning elements disposed between the sliding block and the corresponding spacer for releasably fixing the sliding block, and (b) an elongated slot formed in a side wall thereof and receiving said pin therein for limiting said movement of sliding block with respect to said spacer;

wherein a selected one of said sliding blocks is moved upwardly and pivoted on said pin away from said front side of a respective spacer for insertion of an interface card into said holding device and an inserting slot of a circuit board, said sliding block being subsequently moved downwardly to rest against a top edge of the interface card to releasably secure the interface card.

2. The fixing device for interface cards as claimed in claim 1, wherein an upper surface of said seat has a plurality of notches formed therein respectively disposed in correspondence with said plurality of spacers for respectively receiving said sliding blocks therein subsequent to said sliding blocks being moved upwardly and pivoted.

3. The fixing device for interface cards as claimed in claim 1, wherein said holding device includes a pair of clamping pieces disposed in spaced relationship, said pair of clamping pieces being spaced by a dimension predetermined to clamp the interface card.

4. The fixing device for interface cards as claimed in claim 1, wherein said positioning elements include a moving block coupled to said sliding block, said moving block having a first plate with one end coupled to a respective sliding block and two sides thereof being spaced from sides of said sliding block and a second plate extends from a distal end of said first plate.

5. The fixing device for interface cards as claimed in claim 1, wherein each spacer has a plurality of teeth formed on said top portion thereof and said positioning elements include a plurality of teeth formed on each said sliding block for releasable engagement with said teeth of a respective spacer.

6. The fixing device for interface cards as claimed in claim 4, wherein each spacer has a plurality of teeth formed on said top portion thereof and said positioning elements further includes a plurality of teeth formed on said first plate of said moving block for releasable engagement with said teeth of a respective spacer.

7. The fixing device for interface cards as claimed in claim 4, wherein each said sliding block has two confining blocks formed on a lower end thereof in correspondence with said holding device, said confining blocks being spaced one from the other for receiving an edge of the interface card therebetween.

* * * * *